(12) United States Patent
Kim et al.

(10) Patent No.: US 8,193,619 B2
(45) Date of Patent: Jun. 5, 2012

(54) LEAD FRAME AND SEMICONDUCTOR PACKAGE HAVING THE SAME

(75) Inventors: Geun-Woo Kim, Asan (KR); Ho-Geon Song, Seoul (KR); Man-Hee Han, Asan (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 136 days.

(21) Appl. No.: 12/659,472

(22) Filed: Mar. 10, 2010

(65) Prior Publication Data

US 2010/0237478 A1      Sep. 23, 2010

(30) Foreign Application Priority Data

Mar. 18, 2009   (KR) .................. 10-2009-0023109

(51) Int. Cl.
*H01L 23/495*    (2006.01)

(52) U.S. Cl. . 257/670; 257/676; 257/692; 257/E23.031; 257/E23.141

(58) Field of Classification Search ............ 257/692, 257/E23.031, E23.141, 666–677, E23.032, 257/E23.033, E23.059, E23.004, E23.043–E23.05; 438/111, 112, 123, FOR. 366, FOR. 367, 438/FOR. 377, FOR. 380

See application file for complete search history.

(56) References Cited

U.S. PATENT DOCUMENTS 5,777,380 A * 7/1998 Otsuki et al. ............. 257/675

FOREIGN PATENT DOCUMENTS

| JP | 2-15661 | * | 1/1990 |
| JP | 06-283642 | | 10/1994 |
| JP | 07-122693 | | 5/1995 |
| KR | 10-2005-0020377 | | 3/2005 |

* cited by examiner

*Primary Examiner* — Jasmine Clark

(74) *Attorney, Agent, or Firm* — Harness, Dickey & Pierce, P.L.C.

(57) ABSTRACT

Provided is a lead frame that may include a frame, a lead structure, and a dam bar. The frame may include a plurality of openings configured to receive semiconductor chips. The lead structure may be in the openings. The lead structure may also include inner leads and outer leads. The inner leads may be configured to electrically connect to the semiconductor chips and the outer leads may extend from the inner leads. In example embodiments, the lead structure may extend in a first direction. The dam bar may be arranged between the inner leads and the outer leads. In accordance with example embodiments, the dam bar may extend along a second direction which is substantially perpendicular to the first direction. In example embodiments, the dam bar may have a first strength-reinforcing portion extending along the second direction. Also provided is a semiconductor package having the lead frame.

16 Claims, 4 Drawing Sheets

FIRST DIRECTION   SECOND DIRECTION

LEAD FRAME AND SEMICONDUCTOR PACKAGE HAVING THE SAME

CROSS-REFERENCE TO RELATED APPLICATIONS

This application claims priority under 35 USC §119 to Korean Patent Application No. 2009-23109, filed on Mar. 18, 2009 in the Korean Intellectual Property Office (KIPO), the contents of which are herein incorporated by reference in their entirety.

BACKGROUND

1. Field

Example embodiments relate to a lead frame and a semiconductor package having the same. More particularly, example embodiments relate to a lead frame including an inner lead, an outer lead, and a dam bar for supporting the inner lead and the outer lead, and a semiconductor package having the lead frame.

2. Description of the Related Art

Various semiconductor fabrication processes may be performed on a semiconductor substrate to form a plurality of semiconductor chips. In order to mount the semiconductor chip on a printed circuit board (PCB), a packaging process may be performed on the semiconductor chips to form semiconductor packages.

A conventional semiconductor package may include a semiconductor chip, a lead frame configured to support the semiconductor chip, and a molding member configured to surround the semiconductor chip and the lead frame. The lead frame may include a frame having openings that may be configured to receive the semiconductor chip, inner leads arranged in the openings and electrically connected to the semiconductor chip, outer leads extending from the inner leads, and a dam bar formed between the inner leads and the outer leads to support the inner leads and the outer leads.

In a molding process for forming the molding member, a warpage may be generated due to a thermal coefficient difference between the molding member and the lead frame.

Further, in a cutting process for portions of the dam bar between the leads, a warpage may be generated due to a cutting force applied to the lead frame.

SUMMARY

Example embodiments provide a lead frame having strength with respect to a warpage.

Example embodiments also provide a semiconductor package having the above-mentioned lead frame.

In accordance with example embodiments, a lead frame may include a frame, a lead structure, and a dam bar. The frame may include a plurality of openings configured to receive semiconductor chips. The lead structure may be in the openings. The lead structure may also include inner leads and outer leads. The inner leads may be configured to electrically connect to the semiconductor chips and the outer leads may extend from the inner leads. In example embodiments, the lead structure may extend in a first direction. The dam bar may be arranged between the inner leads and the outer leads. In accordance with example embodiments, the dam bar may extend along a second direction which is substantially perpendicular to the first direction. In example embodiments, the dam bar may have a first strength-reinforcing portion extending along the second direction.

In accordance with example embodiments, a lead frame may include a frame, a lead structure, and a dam bar. The frame may include a strength-reinforcing portion and a plurality of openings and the plurality of openings may be configured to receive semiconductor chips. In example embodiments, the lead structure may be in the openings and may extend along a first direction. The lead structure may include inner leads and outer leads. In example embodiments, the inner leads may be configured to electrically connect to the semiconductor chips and the outer leads may extend from the inner leads. In accordance with example embodiments, a dam bar may be between the inner leads and the outer leads and the dam bar may extend along a second direction that is substantially perpendicular to the first direction.

In accordance with example embodiments, a semiconductor package may include semiconductor chips, a lead frame, and a molding member. In example embodiments the lead frame may include a frame having a plurality of openings receiving the semiconductor chips. The lead structure may also include inner leads in the openings and outer leads extending from the inner leads. In example embodiments, the inner leads may be electrically connected to the semiconductor chips. The lead structure may further include a strength-reinforcing member between the inner leads and the outer leads. In example embodiments the molding member may surround the semiconductor chips and the lead frame and may expose the outer leads.

In accordance with example embodiments, a lead frame may include a frame, a lead structure, and dam bars. The frame may have a plurality of openings configured to receive semiconductor chips. The lead structure may be arranged in the openings along a first direction. Further, the lead structure may include inner leads electrically connected to the semiconductor chips, and outer leads extending from the inner leads. The dam bars may be arranged between the inner leads and the outer leads along a second direction substantially perpendicular to the first direction. Further, the dam bars may have a first strength-reinforcing portion extending along the second direction.

In example embodiments, the first strength-reinforcing portion may include a protrusion protruded from the dam bars. The protrusion may have a semi-circular shape or a notch shape.

In example embodiments, the first strength-reinforcing portion may include a bent portion formed at the dam bars. The bent portion may have a slant shape or a stepped shape.

In example embodiments, the frame may have a second strength-reinforcing portion. The second strength-reinforcing portion may extend along the first direction or the second direction. The second strength-reinforcing portion may have a semi-circular shape or a notch shape.

According to example embodiments, there is provided a lead frame. The lead frame may include a frame, a lead structure, and dam bars. The frame may have a plurality of openings configured to receive semiconductor chips. The frame may have a strength-reinforcing portion. The lead structure may be arranged in the openings along a first direction. Further, the lead structure may include inner leads electrically connected to the semiconductor chips, and outer leads extending from the inner leads. The dam bars may be arranged between the inner leads and the outer leads along a second direction substantially perpendicular to the first direction.

According to example embodiments, there is provided a semiconductor package. The semiconductor package may include semiconductor chips, a lead frame, and a molding member. The lead frame may include a frame, a lead structure, and a strength-reinforcing member. The frame may have openings configured to receive the semiconductor chips. The lead structure may include inner leads arranged in the openings and electrically connected to the semiconductor chips and outer leads extending from the inner leads. The strength-reinforcing member may be formed between the inner leads and the outer leads. The molding member may be configured to surround the semiconductor chips and the lead frame to expose the outer leads.

According to example embodiments, the strength-reinforcing portion may be formed at the dam bar and/or the frame of the lead frame, so that a warpage of the lead frame, which may be caused by a thermal coefficient difference between the lead frame and the molding member and/or a cutting force applied to the dam bar, may be suppressed.

BRIEF DESCRIPTION OF THE DRAWINGS

Example embodiments will be more clearly understood from the following detailed description taken in conjunction with the accompanying drawings.

FIG. 1 is a perspective view illustrating a lead frame in accordance with example embodiments;

FIG. 2 is an enlarged perspective view illustrating a portion "II" in FIG. 1;

FIG. 3 is a cross-sectional view taken along a line III-III' in FIG. 2;

FIG. 4 is a perspective view illustrating a lead frame in accordance with example embodiments;

FIG. 5 is a cross-sectional view taken along a line V-V' in FIG. 4;

FIG. 6 is a perspective view illustrating a lead frame in accordance with example embodiments;

FIG. 7 is a cross-sectional view taken along a line VII-VII' in FIG. 6;

FIG. 8 is a perspective view illustrating a lead frame in accordance with example embodiments;

FIG. 9 is a cross-sectional view taken along a line IX-IX' in FIG. 8; and

FIG. 10 is a cross-sectional view illustrating a semiconductor package in accordance with example embodiments.

DETAILED DESCRIPTION OF THE EMBODIMENTS

Figure 1:
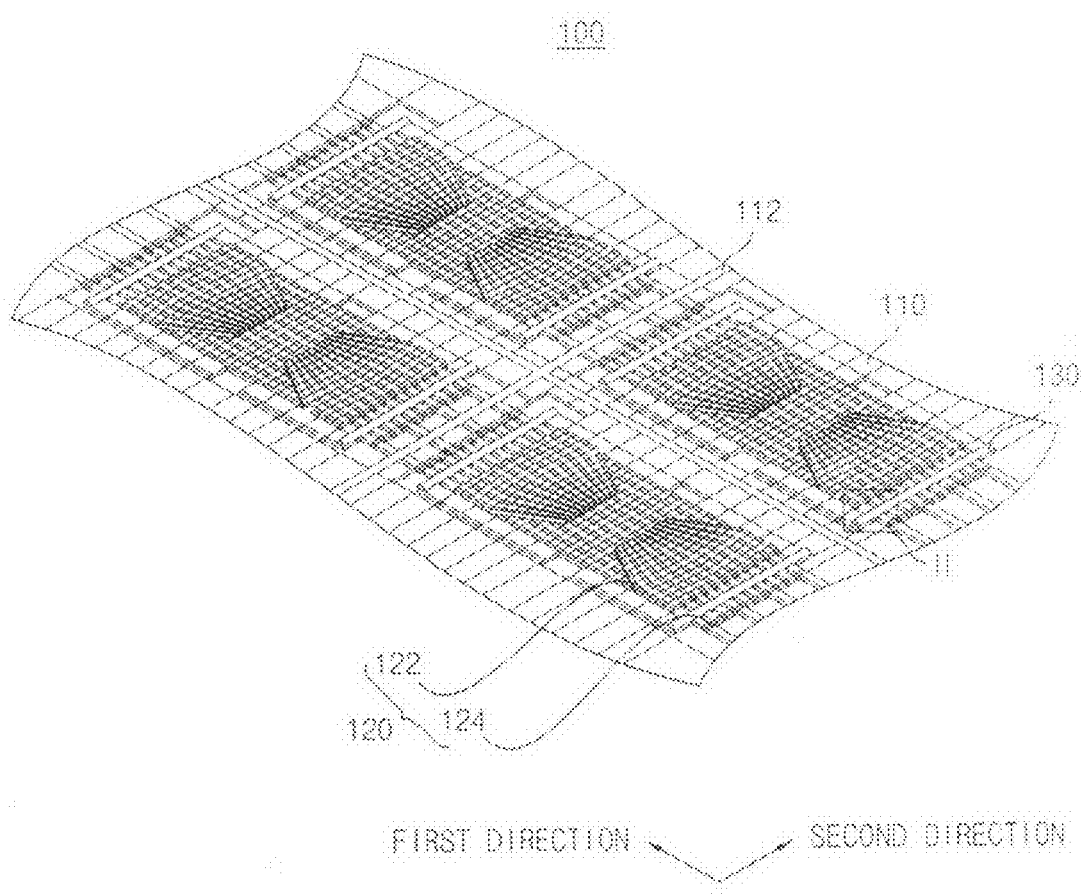
FIGS. 1 to 10 represent non-limiting, example embodiments as described herein.

Example embodiments will be described more fully hereinafter with reference to the accompanying drawings, in which example embodiments are shown. The present invention may, however, be embodied in many different forms and should not be construed as limited to example embodiments set forth herein. Rather, example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Lead Frame

Figure 2:
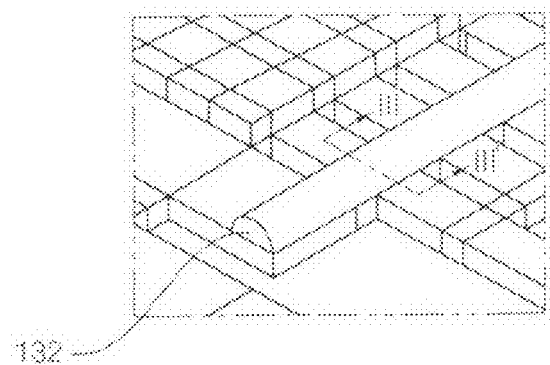
Figure 3:
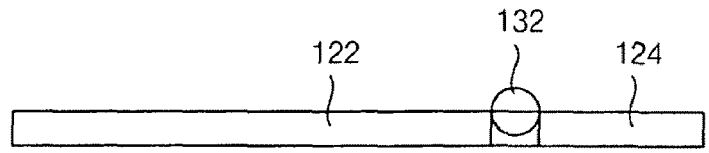

FIG. 1 is a perspective view illustrating a lead frame in accordance with example embodiments. FIG. 2 is an enlarged perspective view illustrating a portion "II" as shown in FIG. 1. FIG. 3 is a cross-sectional view taken along a line in FIG. 2.

Referring to FIGS. 1 to 3, a lead frame 100 according to example embodiments may include a frame 110, a lead structure 120, and a dam bar 130.

In example embodiments, the frame 110 may have a thin plate shape. A rectangular opening may be formed through the frame 110. A semiconductor chip (not shown) may be received in the opening. The frame 110 may include a conductive material, for example, copper and/or aluminum.

The lead structure 120 may include inner leads 122 and outer leads 124. In example embodiments, the lead structure 120 may include a material substantially the same as that of the frame 110.

In example embodiments, the inner leads 122 may be arranged in the opening along a first direction. The inner leads 122 may be arranged in parallel by substantially the same interval. The inner leads 122 may have inner ends configured to electrically connect to bonding pads (not shown) of the semiconductor chip. For example, the inner ends of the inner leads 122 may be configured to electrically connect to the bonding pads of the semiconductor chip via conductive connecting members, for example, metal wires.

In example embodiments, the outer leads 124 may extend from outer ends of the inner leads 122 along the first direction. The outer leads 124 may be connected with the frame 110. The outer leads 124 may be arranged in parallel by substantially the same interval.

The dam bar 130 may be formed between the inner leads 122 and the outer leads 124. The dam bar 130 may be configured to support the inner leads 122 and the outer leads 124. In example embodiments, the dam bar 130 may extend along a second direction substantially perpendicular to the first direction. The dam bar 130 may have both ends connected to the frame 110. In example embodiments, portions of the dam bar 130 between the outer leads 124 may be removed in a molding process for molding the semiconductor chip.

In a molding process for forming a molding member, a warpage may be generated at the lead frame 100 due to a thermal coefficient difference between the lead frame 100 and the molding member. Further, in a cutting process for cutting the portions of the dam bar 130 between the outer leads 124, a warpage may be generated at the lead frame 100 due to a cutting force applied to the lead frame 100.

A first strength-reinforcing portion 132 (an example of a first strength-reinforcing member) for suppressing the warpage of the lead frame 100 may be formed at the dam bar 130. In example embodiments, the warpage of the lead frame 100 may be in inversely proportional to a cross-sectional area of the dam bar 130. Thus, the warpage of the lead frame 100 may be suppressed by increasing the cross-sectional area of the dam bar 130.

In example embodiments, the first strength-reinforcing portion 132 may include a protrusion protruding from an upper surface of the dam bar 130. Because the cross-sectional area of the dam bar 130 may be increased by a cross-sectional area of the protrusion 132, the warpage of the lead frame 100 may be suppressed. In example embodiments, the protrusion 132 may have a semi-circular shape, however, example embodiments are not limited thereto. For example, the protrusion 132 may have a rectangular or triangular shape, or various other shapes that may increase the cross-sectional area of the dam bar 130.

Additionally, a second strength-reinforcing portion 112 (an example of a second strength-reinforcing member) may be formed at the frame 110. Because a packaging process including a molding process and a cutting process may be performed with a semiconductor chip being located in openings of the frame 110, the second strength-reinforcing portion 112 may suppress the warpage of the lead frame 100. In example embodiments, the second strength-reinforcing portion 112 may extend along the first direction and/or the second direction. Further, the second strength-reinforcing portion 112 may have a shape substantially the same as that of the first strength-reinforcing portion 132.

Figure 4:
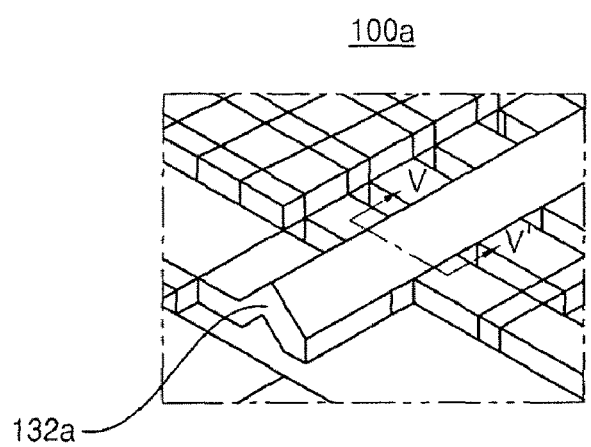
Figure 5:
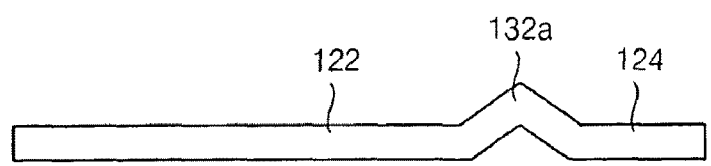

FIG. 4 is a perspective view illustrating a lead frame in accordance with example embodiments, and FIG. 5 is a cross-sectional view taken along a line V-V' in FIG. 4.

A lead frame 100a according to example embodiments may include elements substantially the same as those of the lead frame 100 in FIG. 1 except for a first strength-reinforcing portion and a second strength-reinforcing portion. Thus, the same reference numerals refer to the same elements and any further illustrations with respect to the same elements are omitted herein for brevity.

Referring to FIGS. 4 and 5, the first strength-reinforcing portion 132a (an example of a first strength-reinforcing member) may include a protrusion having a notch shape. The notchlike protrusion 132a may function as to enlarge the cross-sectional area of the dam bar 130.

Further, a second strength-reinforcing portion (not shown) may have a shape substantially the same as that of the notchlike protrusion 132a. Alternatively, the second strength-reinforcing portion 112a may have a shape substantially the same as that of the semi-circular protrusion 132 in FIG. 1.

Figure 6:
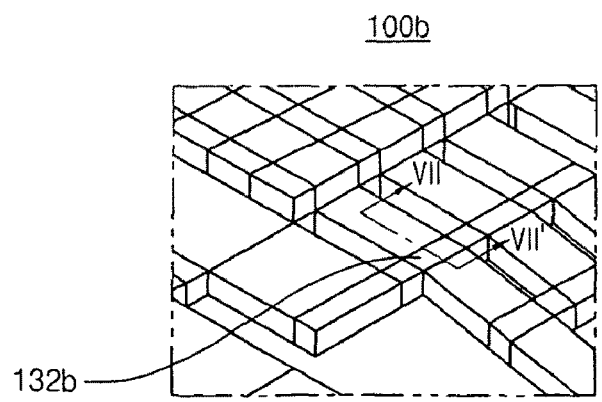
Figure 7:
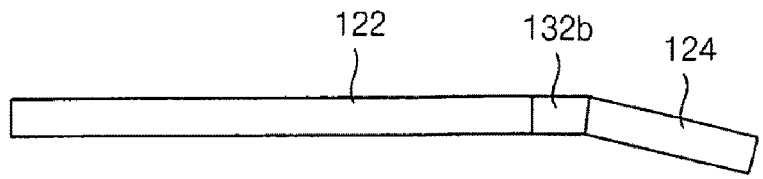

FIG. 6 is a perspective view illustrating a lead frame in accordance with example embodiments, and FIG. 7 is a cross-sectional view taken along a line VII-VII' in FIG. 6.

A lead frame 100b according to example embodiments may include elements substantially the same as those of the lead frame 100 in FIG. 1 except for a first strength-reinforcing portion and a second strength-reinforcing portion. Thus, the same reference numerals refer to the same elements and any further illustrations with respect to the same elements are omitted herein for brevity.

Referring to FIGS. 6 and 7, the first strength-reinforcing portion 132b (an example of a first strength-reinforcing member) may have a bent shape. In example embodiments, the inner lead 122 may be positioned higher than the outer lead 124 due to the bent first strength-reinforcing portion 132b.

Further, the second strength-reinforcing portion (not shown) may have a shape and/or orientation that is substantially the same as that of the semi-circular protrusion 132 or that of the notchlike protrusion 132a.

Figure 8:
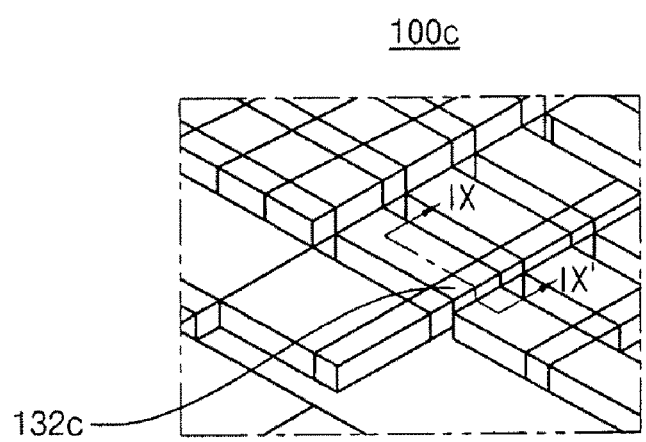
Figure 9:
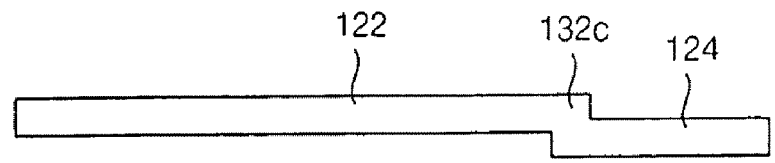

FIG. 8 is a perspective view illustrating a lead frame in accordance with example embodiments, and FIG. 9 is a cross-sectional view taken along a line IX-IX' in FIG. 8.

A lead frame 100c of this example embodiment may include elements substantially the same as those of the lead frame 100 in FIG. 1 except for a first strength-reinforcing portion and a second strength-reinforcing portion. Thus, the same reference numerals refer to the same elements and any further illustrations with respect to the same elements are omitted herein for brevity.

Referring to FIGS. 8 and 9, the first strength-reinforcing portion 132c (an example of a first strength-reinforcing member) may have a stepped shape. In example embodiments, the inner lead 122 may be positioned higher than the outer lead 124 due to the stepped first strength-reinforcing portion 132c.

Further, the second strength-reinforcing portion (not shown) may have a shape substantially the same as that of the semi-circular protrusion 132 or that of the notchlike protrusion 132a.

According to example embodiments, the strength-reinforcing portions may be formed at the dam bar and/or the frame, so that the warpage of the lead frame may be suppressed during a molding process and/or a cutting process.

Semiconductor Package

Figure 10:
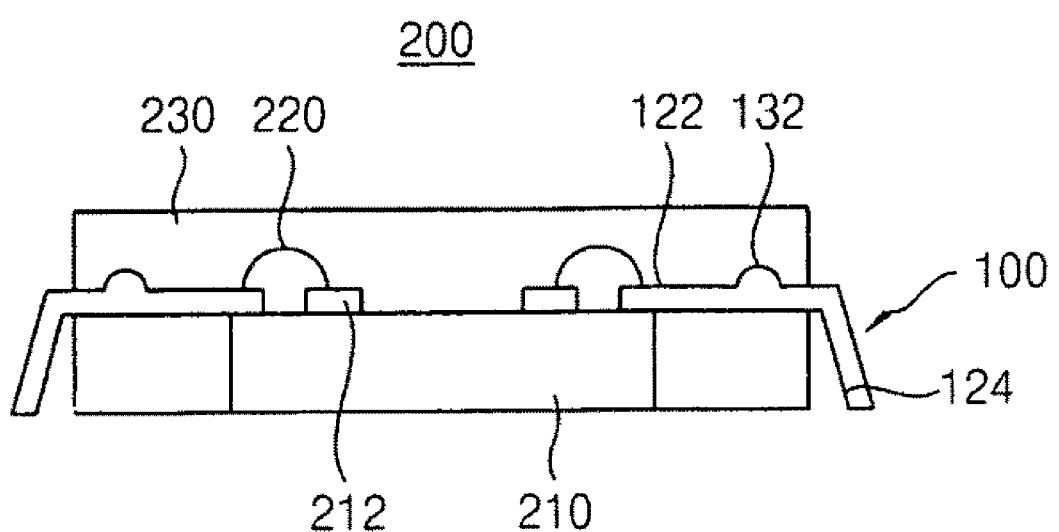

FIG. 10 is a cross-sectional view illustrating a semiconductor package in accordance with example embodiments.

Referring to FIG. 10, a semiconductor package 200 according to example embodiments may include a semiconductor chip 210, a lead frame 100, conductive connecting members 220, and a molding member 230.

The semiconductor chip 210 may be arranged in the opening of the lead frame 100. The semiconductor chip 210 may have bonding pads 212 electrically connected to the inner leads 122 of the lead frame 100.

In example embodiments, the lead frame 100 may be substantially the same as the lead frame in FIG. 1. Thus, any further illustrations with respect to the lead frame 100 are omitted herein for brevity. In example embodiments, the portions of the dam bar 130 between the outer leads 124 may be cut and removed. Therefore, the outer leads 124 may be electrically isolated with each other. Further, any one of the lead frames 100a, 100b and 100c in place of the lead frame 100 may be used in the semiconductor package 200.

The conductive connecting members 220 may electrically connect the inner leads 122 with the bonding pads 212. In example embodiments, the conductive connecting members 220 may include conductive wires, for example, metal wires including gold.

The molding member 230 may be configured to surround the semiconductor chip 210 and the lead frame 100 to expose the outer leads 124. The molding member 230 may protect the semiconductor chip 210 and the lead frame 100 from external impacts. In example embodiments, the molding member 230 may include an epoxy molding compound (EMC).

The semiconductor chip 210 may be arranged in an opening of the lead frame 100. The bonding pads 212 of the semiconductor chip 210 may be electrically connected to the inner leads 122 of the lead frame 100 using the conductive connecting members 220.

The molding member 230 may surround the semiconductor chip 210 and the lead frame 100. In example embodiments, the outer leads 124 may be exposed through the molding member 230. In example embodiments, the lead frame 100 and the molding member 230 may have different thermal coefficients. Thus, a strong warping force may be applied to the lead frame 100. However, the first strength-reinforcing portion 132 and the second strength-reinforcing portion 112 may suppress the warpage of the lead frame 100.

After a molding process, a portion of the dam bar 130 between the outer leads 124 may be removed by a cutting process. In example embodiments, a strong cutting force may be applied to the lead frame 100. However, the first strength-reinforcing portion 132 and the second reinforcing portion 112 may firmly support the lead frame to suppress the warpage of the lead frame 100.

After the cutting process, the outer leads 124 may be bent by a forming process in accordance with applications of the semiconductor package 200. In the forming process, the first strength-reinforcing portion 132 may reinforce the strength of the lead frame 100, so that the warpage of the lead frame 100 may be suppressed.

According to example embodiments, the strength-reinforcing portion may be formed at the dam bar and/or the frame of the lead frame, so that a warpage of the lead frame, which may be caused by a thermal coefficient difference between the lead frame and the molding member and/or a cutting force applied to the dam bar, may be suppressed.

The foregoing is illustrative of example embodiments and is not to be construed as limiting thereof. Although example embodiments have been described, those skilled in the art will readily appreciate that many modifications are possible in example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific example embodiments disclosed, and that modifications to the disclosed example embodiments, as well as other example embodiments, are intended to be included within the scope of the appended claims.

What is claimed is:

1. A lead frame comprising:
    a frame having a plurality of openings configured to receive semiconductor chips;
    a lead structure in the openings, the lead structure including inner leads and outer leads, the inner leads being configured to electrically connect to the semiconductor chips and the outer leads extending from the inner leads, the lead structure extending in a first direction;
    a dam bar between the inner leads and the outer leads, the dam bar extending along a second direction substantially perpendicular to the first direction; and
    a strength-reinforcing member on the dam bar.

2. The lead frame of claim 1, wherein the strength-reinforcing member includes a protrusion, the protrusion including one of a semi-circular shape and a notch shape.

3. The lead frame of claim 1, wherein the strength-reinforcing member includes a bent portion, the bent portion including one of a slant shape and a stepped shape.

4. The lead frame of claim 1, wherein the frame further includes a second strength-reinforcing portion extending along one of the first direction and the second direction.

5. The lead frame of claim 4, wherein the second strength-reinforcing portion has one of a semi-circular shape and a notch shape.

6. A lead frame comprising:
    a frame including a strength-reinforcing portion and a plurality of openings, the plurality of openings being configured to receive semiconductor chips;
    a lead structure in the openings and extending along a first direction, the lead structure including inner leads and outer leads, the inner leads being configured to electrically connect to the semiconductor chips and the outer leads extending from the inner leads; and
    a dam bar between the inner leads and the outer leads, the dam bar extending along a second direction substantially perpendicular to the first direction.

7. The lead frame of claim 6, wherein the strength-reinforcing portion includes a protrusion protruding from the frame.

8. The lead frame of claim 7, wherein the protrusion has one of a semi-circular shape and a notch shape.

9. A semiconductor package comprising:
semiconductor chips;
a lead frame including
a frame having a plurality of openings receiving the semiconductor chips,
a lead structure including inner leads in the openings and outer leads extending from the inner leads, the inner leads being electrically connected to the semiconductor chips, and
a strength-reinforcing member between the inner leads and the outer leads; and
a molding member surrounding the semiconductor chips, the lead frame, and the strength-reinforcing member and exposing the outer leads.

10. The semiconductor package of claim 9, wherein
the lead frame further includes a dam bar between the inner leads and the outer leads,
the lead structure extends in a first direction,
the dam bar extends in a second direction substantially perpendicular to the first direction, and
the strength-reinforcing member is on the dam bar.

11. The semiconductor package of claim 10, wherein the first strength-reinforcing member includes a protrusion protruding from the dam bar.

12. The semiconductor package of claim 11, wherein the protrusion has one of a semi-circular shape and a notch shape.

13. The semiconductor package of claim 10, wherein the first strength-reinforcing member includes a bent portion at the dam bar.

14. The semiconductor package of claim 13, wherein the bent portion has one of a slant shape and a stepped shape.

15. The semiconductor package of claim 10, wherein the frame further includes a second strength-reinforcing member extending along one of the first direction and the second direction.

16. The semiconductor package of claim 15, wherein the second strength-reinforcing member has one of a semi-circular shape and a notch shape.

* * * * *